US012414466B2

(12) United States Patent
Yajima

(10) Patent No.: US 12,414,466 B2
(45) Date of Patent: Sep. 9, 2025

(54) COMMUNICATION DEVICE AND POWER SOURCE DEVICE

(71) Applicant: AmaterZ, Inc., Tokyo (JP)

(72) Inventor: Masakazu Yajima, Tokyo (JP)

(73) Assignee: AMATERZ, INC., Tokyo (JP)

( * ) Notice: Subject to any disclaimer, the term of this patent is extended or adjusted under 35 U.S.C. 154(b) by 0 days.

(21) Appl. No.: 18/283,702

(22) PCT Filed: Mar. 28, 2022

(86) PCT No.: PCT/JP2022/015044
§ 371 (c)(1),
(2) Date: Sep. 22, 2023

(87) PCT Pub. No.: WO2022/210553
PCT Pub. Date: Oct. 6, 2022

(65) Prior Publication Data
US 2024/0180037 A1 May 30, 2024

(30) Foreign Application Priority Data
Mar. 29, 2021 (JP) ................. 2021-056242

(51) Int. Cl.
H10N 10/82 (2023.01)
H04B 1/3888 (2015.01)
(52) U.S. Cl.
CPC .......... H10N 10/82 (2023.02); H04B 1/3888 (2013.01)
(58) Field of Classification Search
CPC ............................. H10N 10/00–857
USPC ................................. 136/200–242
See application file for complete search history.

(56) References Cited

U.S. PATENT DOCUMENTS

| 5,889,735 A | 3/1999 | Kawata et al. |
| 2003/0110779 A1* | 6/2003 | Otey ........... F25B 21/02 62/3.2 |
| 2008/0258694 A1* | 10/2008 | Quist ........... F03D 9/11 322/17 |

(Continued)

FOREIGN PATENT DOCUMENTS

| JP | 2002-257961 A | 9/2002 |
| JP | 2003-22492 A | 1/2003 |

(Continued)

OTHER PUBLICATIONS

KR-20140123462-A English (Year: 2014).*
International Search Report (PCT/ISA/210) issued in PCT/JP2022/015044 mailed on Jun. 14, 2022.

Primary Examiner — Bach T Dinh
(74) Attorney, Agent, or Firm — Birch, Stewart, Kolasch & Birch, LLP

(57) ABSTRACT

A communication device 100 of the present invention is placed at a place which is composed of a hole configured from a side wall 11 or/and a bottom and a cover 12 covering the hole, the communication device comprising: a plate member 101 obtaining heat of the cover; a heat transfer member 102 connected to the plate member to transfer the heat of the cover; a thermoelectric generation unit 103 in which a first junction is connected to the heat transfer member and a second junction is connected to the side wall, the bottom or liquid existing in the hole; and a communication unit 104 performing communication using electric power generated by the thermoelectric generation unit.

12 Claims, 6 Drawing Sheets

(56) References Cited

U.S. PATENT DOCUMENTS

| | | | |
|---|---|---|---|
| 2017/0110386 A1 | 4/2017 | Suzuki et al. | |
| 2017/0127156 A1* | 5/2017 | Rodriguez, Jr | H04Q 9/00 |
| 2017/0222115 A1* | 8/2017 | Kurihara | H10N 10/13 |
| 2019/0148616 A1 | 5/2019 | Nakagawa et al. | |
| 2019/0189882 A1* | 6/2019 | Hiller | C01C 1/04 |

FOREIGN PATENT DOCUMENTS

| | | |
|---|---|---|
| JP | 3544827 B2 | 7/2004 |
| JP | 2013-8780 A | 1/2013 |
| JP | 2015-171308 A | 9/2015 |
| JP | 2016-14255 A | 1/2016 |
| JP | 6350665 B2 | 7/2018 |
| JP | 6361730 B2 | 7/2018 |
| JP | 2019-161790 A | 9/2019 |
| JP | 6669256 B2 | 3/2020 |
| KR | 20140123462 A * | 10/2014 |

\* cited by examiner

COMMUNICATION DEVICE AND POWER SOURCE DEVICE

CROSS REFERENCE TO RELATED APPLICATIONS

The present application is based on and claims the benefit of priority from Japanese Patent Application No. 2021-056242 filed on Mar. 29, 2021, the disclosure of which is incorporated herein by reference.

TECHNICAL FIELD

The present invention relates to a communication device provided with a maintenance hole or a hand hole and the like, and a power source device mountable on the communication device.

BACKGROUND

There have been devices for detecting abnormality by obtaining environmental information of maintenance holes and hand holes. Also, a technique for collecting, storing, and utilizing various data by transmitting the data collected from afar using low-power and long-distance wireless communication scheme such as LPWA (Low Power Wide Area) and the like has been known.

PRIOR ART LITERATURE

Patent Literature

Patent Literature 1: JP2006-233436
Patent Literature 2: JP2015-12431

SUMMARY OF THE INVENTION

In case that environmental information of the maintenance holes and hand holes is detected by sensors and transmitted using wireless communication, a power source will be necessary for operating a communication device. However, the maintenance holes and the hand holes are usually covered by metal covers and sunlight does not reach into the maintenance holes and hand holes, and thus it is difficult to generate electric power by sunlight. Also, if a primary battery is used, it will be necessary to periodically replace the battery.

The purpose of the present invention is to realize a communication device which does not need battery replacement.

A communication device (100) according to one embodiment of the present application is a communication device placed at a place which is composed of a hole configured from a side wall (11) or/and a bottom and a cover (12) covering the hole, the communication device comprising: a plate member (101) obtaining heat of the cover; a heat transfer member (102) connected to the plate member to transfer the heat of the cover; a thermoelectric generation unit (103) in which a first junction is connected to the heat transfer member and a second junction is connected to the side wall, the bottom or liquid existing in the hole; a communication unit (104) performing communication using electric power generated by the thermoelectric generation unit. Here, the wording "heat" includes not only a case in which a temperature of the cover is higher than a temperature of the side wall, but also a case in which a temperature of the cover is lower than a temperature of the side wall, that is in which minus-evaluated heat is transferred from the cover to the side wall. Also, wording "obtain" means that heat is transferred to a plate member by transmission or conduction.

The numbers in parentheses attached to the claim elements of the present disclosure described in this section and claims indicate the relationship between the present invention and the embodiments described below, and are not intended to limit the present invention.

Advantageous Effects of Inventions

According to the present invention, it is possible to realize a communication device which does not need battery replacement.

DETAILED DESCRIPTION

Figure 1:
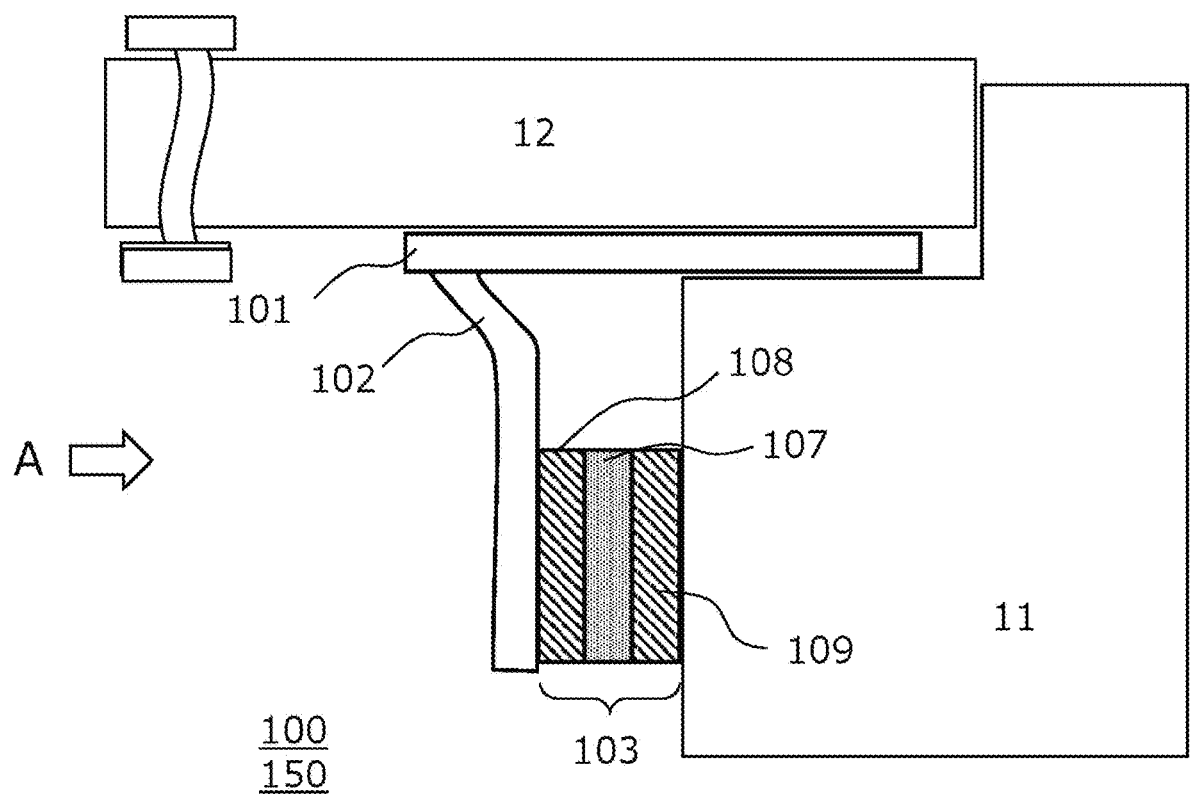
FIG. 1 is a side view of a communication device in the present embodiment.

Embodiments of the present invention will now be described with reference to the drawings.

Note that the present invention indicates any inventions in claims and not limited to the embodiments below. Further, at least words within the double quotation means words and phrases described in the claims and is not limited to the following embodiments.

Configurations and methods described in dependent claims of claims should be interpreted as arbitrary configurations and arbitrary methods in the invention of independent claims. Configurations and methods of following embodiments corresponding to configurations and methods described in dependent claims, and configurations and methods described only in the following embodiments without descriptions in claims should be interpreted as arbitrary configurations and arbitrary methods in the present invention. In a case that the scope of claims is broader than descriptions of the embodiments, configurations and methods described in the following embodiments are just examples of configurations and methods of the present invention, which should be interpreted as arbitrary configurations and arbitrary methods in the present invention. In any cases, essential configurations and methods of the present invention should be interpreted based on independent claims.

Any effects described in embodiments are effects obtained when a configuration of an embodiment as an example of this disclosure and are not necessarily an effect of the present invention.

When there are a plurality of embodiments, the configuration disclosed in each embodiment is not limited to each embodiment alone, and may be combined across the embodiments. For example, the configuration disclosed in one embodiment may be combined with another embodiment. Further, the disclosed configurations may be collected and combined in each of the plurality of embodiments.

The problem described in this disclosure is not a publicly known problem, but person including the inventor has independently found out, and is a fact that affirms the inventive step of the invention together with the configuration and method of the present disclosure.

Embodiment 1

1. Places where a Communication Device and a Power Source Device of the Present Embodiment are Placed In order for workers to access from ground for maintain (i.e. inspection, repairing, cleaning, ventilation, and the like) underground sewer, culvert, water supply, buried electrical and communication cables and buried gas pipe, vertical holes are provided with ground. Such a vertical hole is called as maintenance hole or hand hole. Otherwise, in order to drain water on streets, gutters are provided with at least one side of streets.

The maintenance hole, the hand hole, and the gutter (corresponding to "hole") are composed of a side wall 11. The side wall 11 is made from, for example, concrete or soil.

Also, the maintenance hole, the hand hole, or the gutter is covered by a metal cover 12 having circle or rectangular shape so that people or object would not accidentally fall down.

A communication device 100 and a power source device 150 of the present embodiment are placed at a space composing of the "hole" and a cover 12.

2. Configuration of the Communication Device and the Power Source Device

Figure 2:
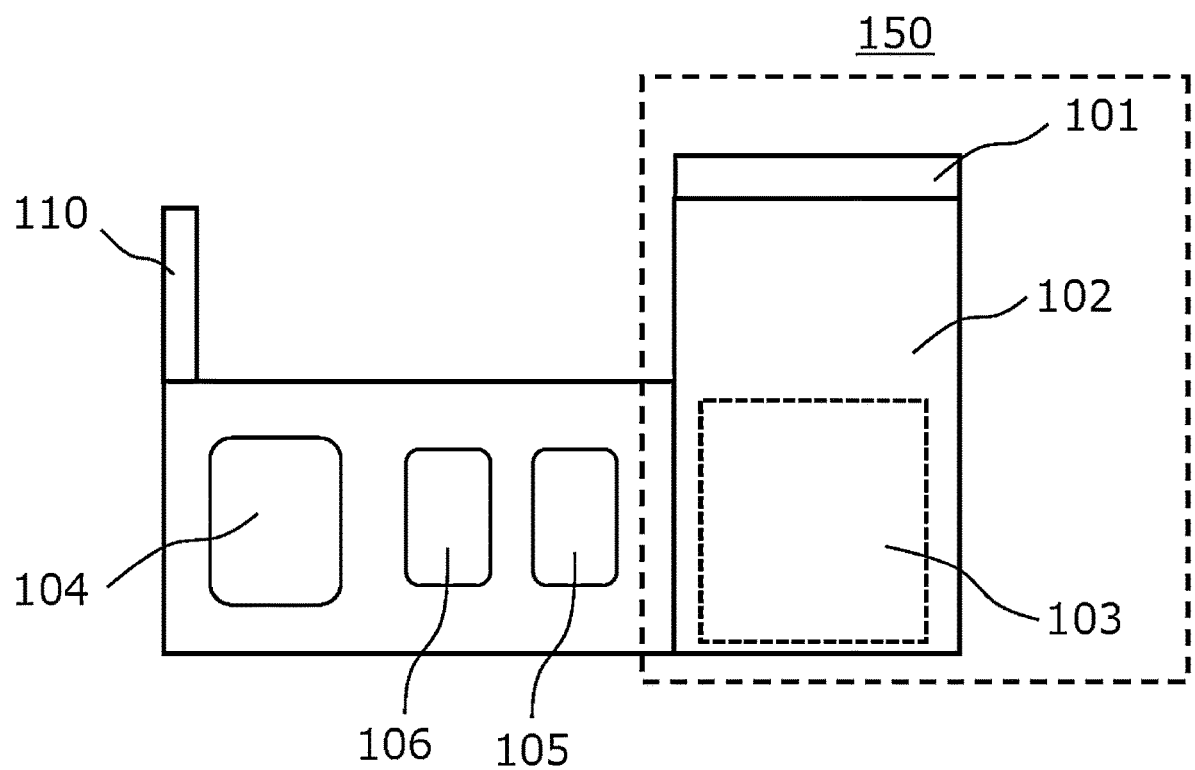
FIG. 2 is a front view of the communication device in the present embodiment.

Referring to FIG. 1 and FIG. 2, the configuration of the communication device 100 and the power source device 150 of the present embodiment will be described. FIG. 1 is a side view of the communication device 100 of the present embodiment, and FIG. 2 is a front view of the communication device 100 seeing from direction A of FIG. 1. The communication device 100 comprises a plate member 101, a heat transfer member 102, a thermoelectric generation unit 103, a communication unit 104, a secondary battery 105, and a primary battery 106.

The plate member 101 is a member having plate shape, which is sandwiched between a back surface of the cover 12 and an upper surface of the side wall 11 when the communication device 100 is placed at a space composed of the hole and the cover 12.

An upper surface of the plate member 101 contacts with the back surface of the cover 12 to obtain heat of the cover 12. The plate member 101 is made from metal having high thermal conductivity, such as iron (including alloy), copper (including alloy), or aluminum. Otherwise, thermal conductive plastic or ceramics may be used.

Figure 3:
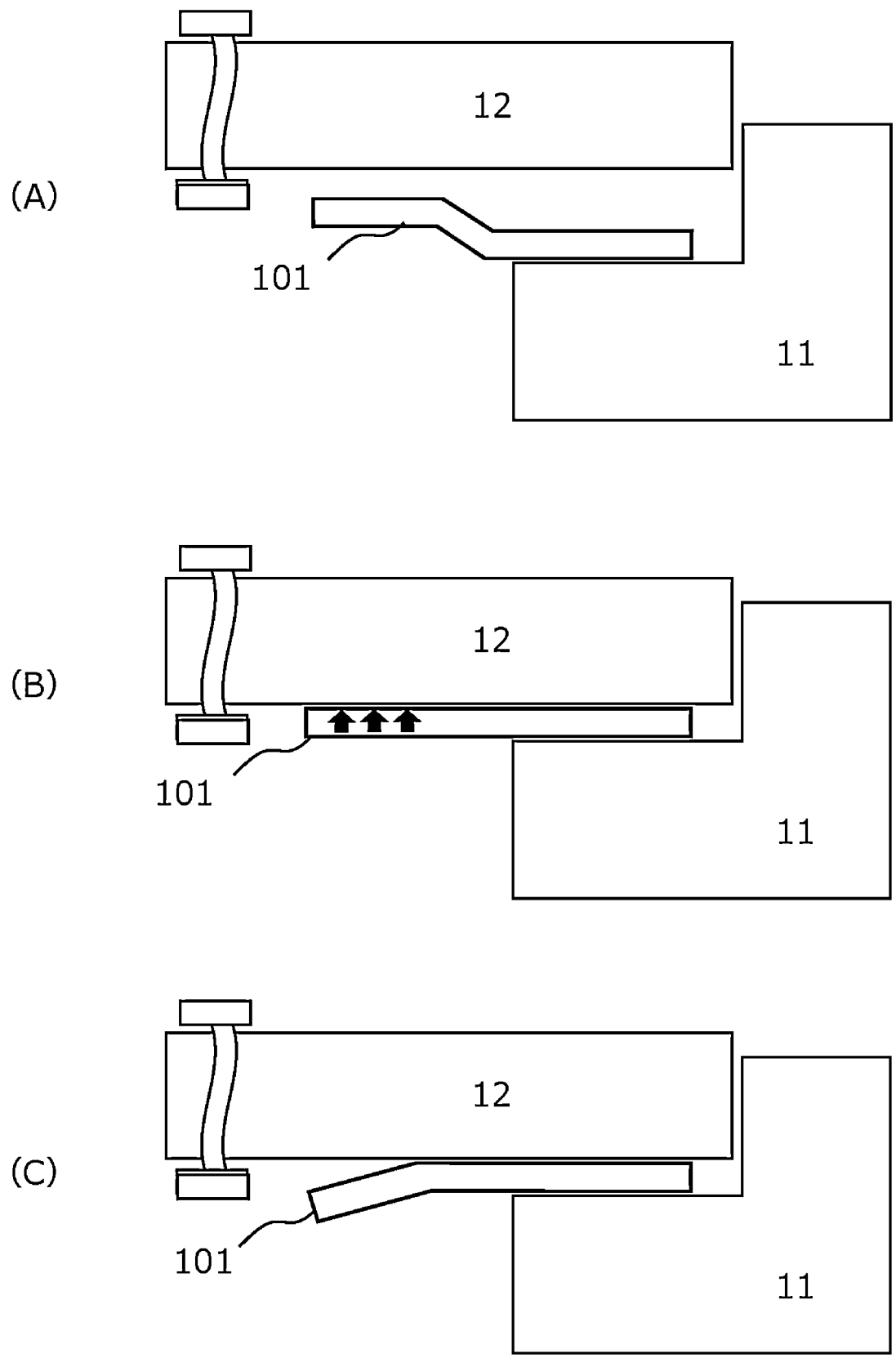
FIG. 3 is a diagram illustrating a placing condition of plate member of the communication device in the present embodiment.

Elastically deformable leaf spring may be used as the plate member 101. For example, as shown in FIG. 3(A), the plate member 101 has a shape in which a projecting part from the side wall 11 into the hole side is upwardly warping. Then, the hole is covered by the cover 12 to elastically deform the warping part by being pushed by the cover 12, and as a result, as shown in FIG. 3(B), the back surface of the cover 12 is always applied stress from the plate member 101 as shown by the arrow. This configuration enables to keep a good contact between the plate member 101 and the cover 12.

Otherwise, the plate member 101 may have a shape in which, when the plate member 101 is provided so as to be sandwiched between the back surface of the cover 12 and the upper surface of the side wall 11, an edge of the plate member 101 is warped toward the side wall 11 as shown in FIG. 3(C) to generate stress pushing the thermoelectric generation unit 103 against the side of the side wall 11 via the heat transfer member 102. This configuration enables to keep a good contact between the thermoelectric generation unit 103 and side wall 11.

It should be noted that any material having thermal insulation may be applied to the lower surface of the plate member 101, that is, to a surface contacting the upper surface of the side wall 11, or any thermal insulation may be sandwiched between the plate member 101 and the upper surface of the side wall 11. This configuration enables to prevent heat of the cover 12 from being directly transferred to the side wall 11 via the plate member 101. The plate member 101 is not necessary to be a plate shape. For example, it may be a shape which can contact the back surface of the cover, the "plate member" may be alternatively called as a cover contact member or may be read as a cover contact member.

According to the plate member 101 of the present embodiment, there is a space between the cover 12 and the side wall 11 and an area directly contacting the cover 12 and the side wall 11 becomes smaller, which enables heat of the cover 12 to prevent from being directly transferred to the side wall 11. Also, according to the plate member 101 of the present embodiment, there is a space between the cover 12 and the side wall 11 and radio wave used by the communication unit 104 described below is leaked from the space, which enables to improve communication quality to a base station device outside the hole.

One end of the heat transfer member 102 is connected to the plate member 101, and the other end is connected to the first junction of the thermoelectric generation unit 103 to transfer the heat of the cover 12 to the thermoelectric generation unit 103.

Any plate or rod shape member or heat pipe made from high thermal conductive material such as copper may be used as the heat transfer member 102. Heat pipe is a member having a principle or structure in which heat is transferred by using transfer of hydraulic fluid inside. If the heat pipe is used, a plurality of heat pipes having circular cross section may be bundled.

Otherwise, when placing the communication device 100, it is possible to generate stress which pushes the thermoelectric generation unit 103 against the side of the side wall 11 by configuring or placing the heat transfer member 102 itself elastically deformable, which enables to keep a good contact between the thermoelectric generation unit 103 and the side wall 11. It should be noted that the heat transfer member 102 and the plate member 101 may be configured to be as one member. In this case, this one member is the heat transfer member 102 and also the plate member 101. Also, the thermoelectric generation unit 103 described below may be directly connected to the plate member 101. In this case, the plate member 101 also has a function of the heat transfer member 102.

The thermoelectric generation unit 103 in which a first junction is connected to the heat transfer member 102 and a second junction is connected to the side wall 11 performs thermoelectric power generation using Seebeck effect. The first junction and the second junction include line or surface.

The thermoelectric generation unit 103 is composed of a thermoelectric power generation element 107, and thermally conductive adhesives 108 and 109. The thermoelectric power generation element 107 is a power generation element using Seebeck effect, which is a power generation device in which one junction is contacted with high heat source and the other junction is contacted with low heat source to generate a potential difference to convert thermal energy into electric energy. The thermoelectric power generation element 107 may use power generation element made from, for example, Bismuth-tellurium (Bi—Te) based, Lead-tellurium (Pb—Te) based, silicon-germanium (Si—Ge) based material. The thermoelectric power generation element 107 may also use skeleton-type.

Both surfaces of the thermoelectric power generation element 107 may be made from high thermal conductive material. Examples include copper, aluminum (after alumite treatment is preferable), stainless (e.g. SUS304), ceramics, or thermal conductive plastic.

The thermally conductive adhesives 108 and 109 are provided on each surface of the thermoelectric power generation element 107. For example, alfagel, silicone, or metallic adhesive may be used as the thermally conductive adhesives 108 and 109. The thermally conductive adhesive 108 configures a first junction to be connected to the heat transfer member 102. The thermally conductive adhesive 109 configures a second junction to be connected to the side wall 11. In the present embodiment, a position of the second junction is an upper side of the side wall 11, however, it may be near bottom of the hole. In this case, any heat transfer member such as a heat pipe may be provided between the thermally conductive adhesive 109 and the side wall 11. In this case, the heat pipe also configures the thermoelectric generation unit 103.

In the present embodiment, the thermoelectric generation unit 103 is connected to the heat transfer member 102 and the side wall 11 via the thermally conductive adhesives 108 and 109, however, the thermoelectric power generation element 107 may be directly connected to the heat transfer member 102 and the side wall 11 without the thermally conductive adhesives 108 and 109. Instead of the thermally conductive adhesives 108 and 109, any thermal conductive material having no adhesivity may be used.

The communication unit 104 performs communication using electric power generated by the thermoelectric generation unit 103. Any wireless communication scheme can be used as the communication scheme of the communication unit 104. For example, broadband cellular communication called 3G, 4G, 5G or low-power and long-distance wireless communication scheme (LPWA (Low Power Wide Area)) scheme which enables lower power consumption and long-distance communication may be used. LPWA scheme is a communication scheme which mainly uses 800/900 MHz band called Sub-Giga band, which includes, but is not limited to, eMTC (enhanced Machine Type Communication) proposed by 3GPP (Third Generation Partnership Project), NB-IOT (Narrow Band Internet of Things) optimized to perform small data communication, SIGFOX™ developed by Sigfox, or LoRa™ developed by Semtech. PARCA™ which features broadcast typed bidirectional communication proposed by the present applicant may be used. Otherwise, short-distance wireless communication scheme such as Wi-Fi™, ZigBee™, Bluetooth™, Bluetooth Low Energy (BLE), FeliCa™, NFC (Near Field Communication), or RFID may be used.

The communication unit 104 may be configured to be supplied electric power generated by the thermoelectric generation unit 103 directly from the thermoelectric generation unit 103, however, it may be alternatively configured to be supplied electric power, which is generated by the thermoelectric generation unit 103 and is stored at the secondary battery 105, from the secondary battery 105.

Furthermore, the communication unit 104 may be supplied electric power from the primary battery 106. Especially, when temperature difference between the cover 12 and the side wall 11 is lower than a predetermined threshold, enough electric power will not be supplied from the thermoelectric generation unit 103 and then electric power stored at the secondary battery 105 becomes insufficient. Only in such a case, the communication unit 104 may be supplied electric power from the primary battery 106 as a backup battery.

The communication unit 104 transmits an output signal of a sensor obtaining environmental information. For example, the communication unit 104 transmits the output signal of the sensor by providing an input terminal of the sensor with the communication device 100 and connecting the sensor to the input terminal.

Any sensor for obtaining necessary environmental information may be used. Examples include a temperature sensor for measuring temperature in the maintenance hole, a humidity sensor for measuring humidity in the maintenance hole. Other examples include a gas sensor for detecting gas in the maintenance hole, a corrosion potential sensor (voltmeter or ammeter) for measuring corrosion potential of the pipe in the maintenance hole.

The communication unit 104 may comprise a RF circuit, a power circuit, or a sensing circuit.

An antenna 110 is connected to the communication unit 104 to transmit the output signal output from the communication unit 104. The antenna 110 may be an inverted-F board antenna or a whip antenna. It is desirable to provide the antenna 110 to be separated from the heat transfer member 102. This enables to improve antenna sensitivity. Also, the antenna 110 may be grounded to the cover 12. This enables to improve antenna sensitivity.

The power source device 150 of the present embodiment comprises the plate member 101, the heat transfer member 102, and the thermoelectric generation unit 103. The power source device 150 may further comprises the secondary battery 105 and the primary battery 106.

3. Operation of the Communication Device and the Power Source Device

Figure 4:
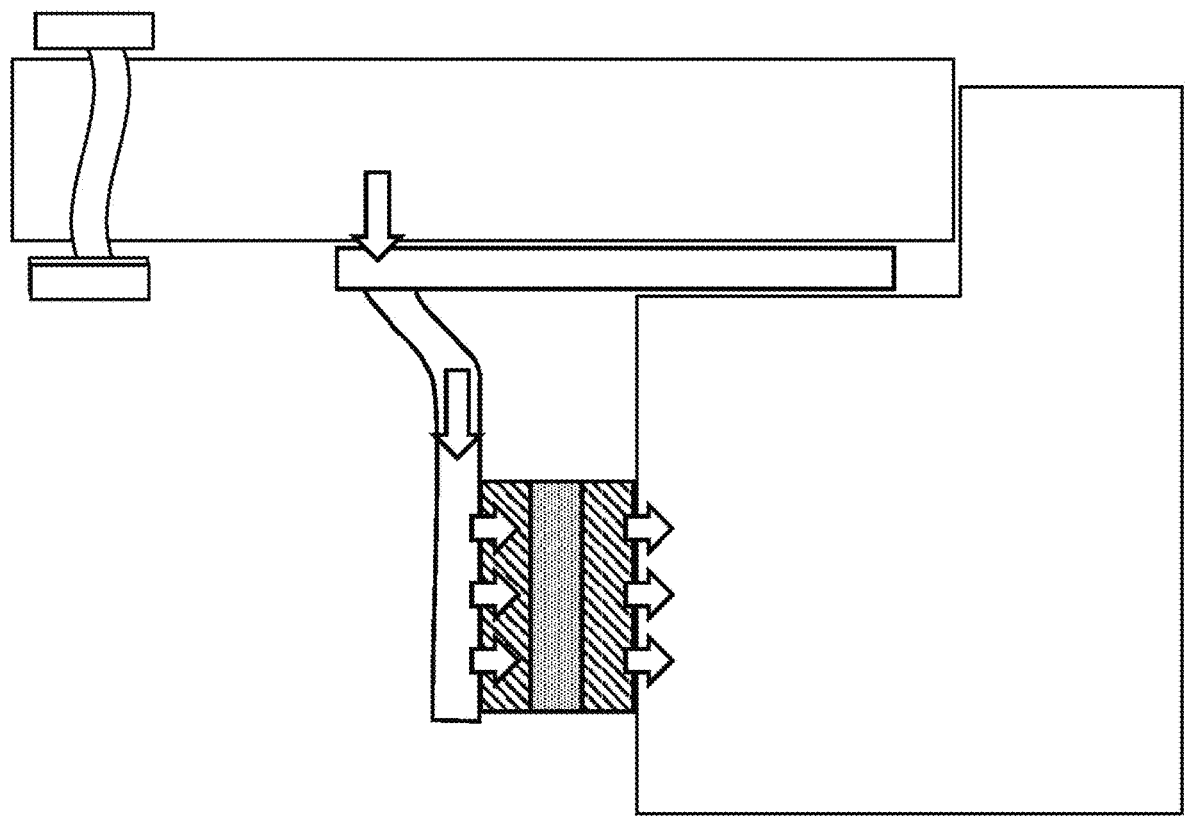
FIG. 4 is a diagram illustrating an operation of the communication device in daytime in present embodiment.
Figure 5:
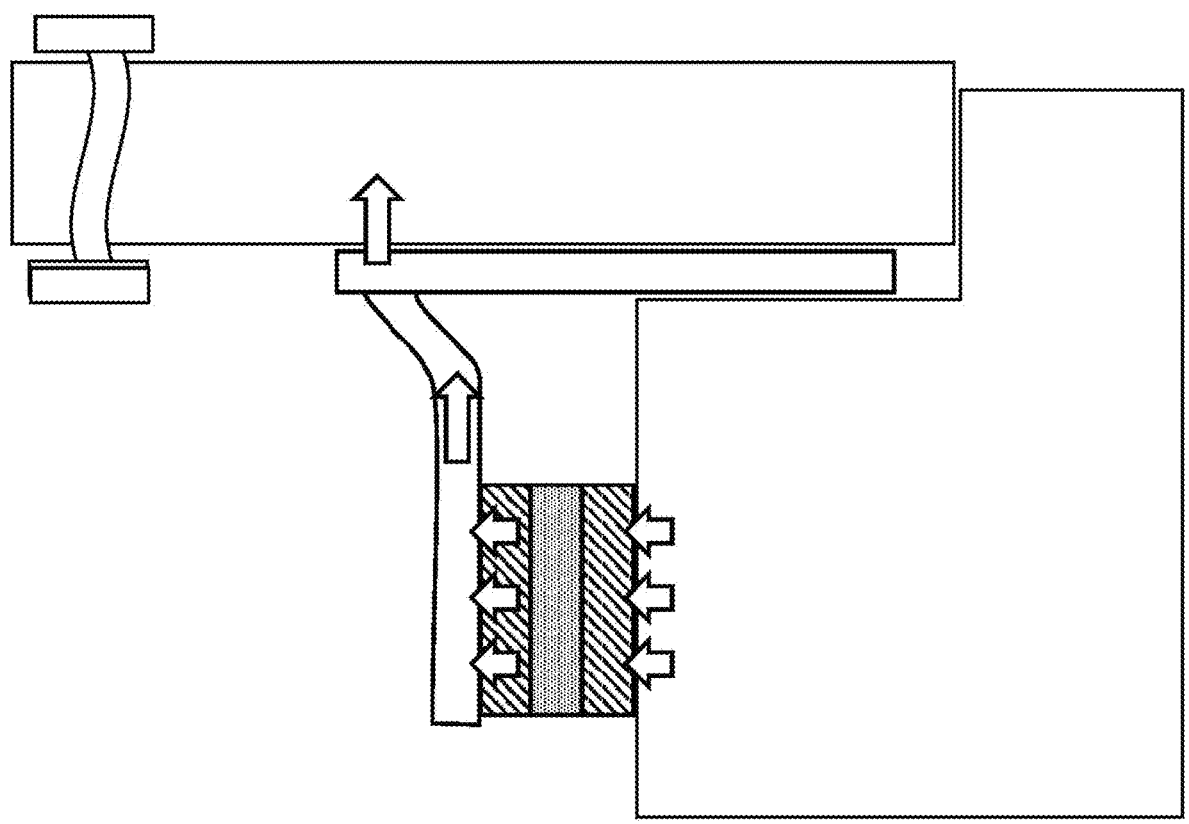
FIG. 5 is a diagram illustrating an operation of the communication device in night time in present embodiment.

Referring to FIG. 4 and FIG. 5, operations of the communication device 100 and the power source device 150 of the present embodiment will be described. FIG. 4 shows a condition in daytime, and FIG. 5 shows a condition in night time.

As shown in FIG. 4, since the temperature of the cover 12 rises by receiving radiant heat of the sun in daytime, the temperature of the cover 12 is higher than the temperature of the side wall 11. Therefore, the heat is transferred to the side wall 11 via the plate member 101, the heat transfer member 102, and the thermoelectric generation unit 103 in order. The temperature difference (i.e. heat flux) between the cover 12 and the side wall 11 at this time enables the thermoelectric generation unit 103 to generate electric power.

On the other hand, as shown in FIG. 5, since the temperature of the cover 12 decreases because of the drop in outside temperature in night time, the temperature of the side wall 11 is higher than the temperature of the cover 12. Therefore, the heat is transferred to the cover 12 via the side wall 11, the thermoelectric generation unit 103, the heat transfer member 102 in order. The temperature difference (i.e. heat flux) between the cover 12 and the side wall 11 at this time enables the thermoelectric generation unit 103 to generate electric power.

However, in cases as shown in FIG. 4 and FIG. 5, since the direction of current generated by the thermoelectric generation unit 103 is reversed, the thermoelectric generation unit 103 can be regarded as an alternator with a long period. Therefore, by providing a rectifier circuit (charge circuit) not shown in figures with the thermoelectric generation unit 103, it can convert from alternating current into direct current.

It should be noted that the present embodiment was described on the premise of the situation shown in FIG. 4, however, in case of a situation shown in FIG. 5, the heat transferred direction is read as reverse direction. Otherwise, in case of the situation shown in FIG. 5, it should be interpreted that minus-evaluated heat is transferred from the cover 12 to the side wall 11.

4. Other Configurations

Figure 6:
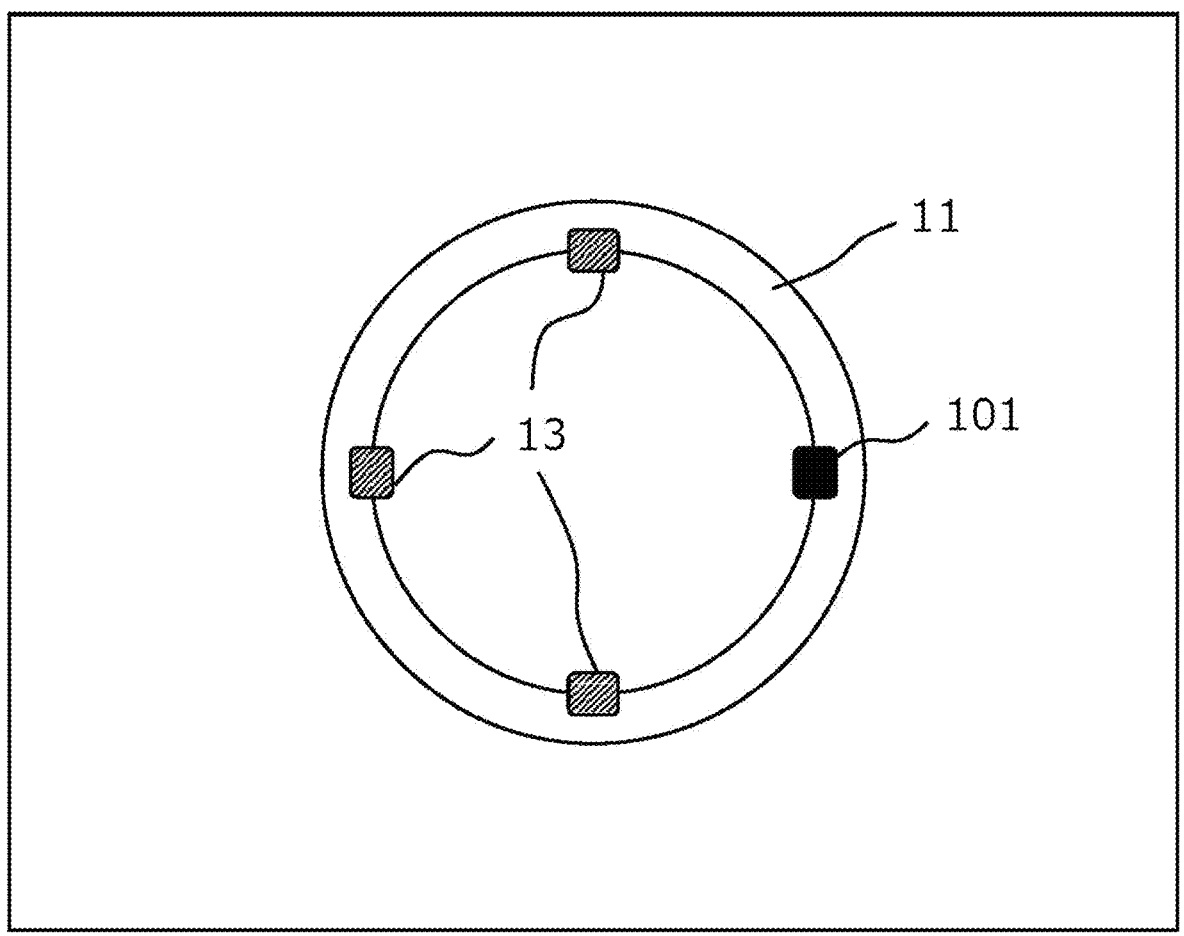
FIG. 6 is a diagram illustrating a placing condition of the communication device in the present embodiment.

FIG. 6 is a diagram of the maintenance hole seen from above without the cover 12. The plate member 101 of the communication device 100 of the present embodiment is placed so as to be put on the upper surface of the side wall 11. In addition, dummy spacers 13 having the same thick as the plate member 101 may be provided with other area of the side wall 11.

Since the cover 12 would not directly contact with the side wall 11 by providing dummy spacers 13, the heat of the cover 12 is not directly transferred to the side wall 11. Therefore, the temperature difference between the cover 12 and the side wall 11 can be obtained. Also, since there is a space between the cover 12 and the side wall 11 by providing the dummy spacers 13, the radio wave leaking from the space increases. As a result, it is possible to improve communication quality to the base station device outside the hole.

Embodiment 2

In Embodiment 1, the second junction of the thermoelectric generation unit 103 is connected to the side wall 11, however, in the present embodiment, a configuration in which the second junction is connected to other than the side wall 11 will be described.

For example, in case that the hole is composed of the side wall 11 and the bottom, the second junction may be connected to the bottom of the hole. Otherwise, in case that there is liquid such as water in the hole, the second junction is provided with the liquid surface or in the liquid to be connected to the liquid. Alternatively, it may be connected to a gas pipe or a water pipe provided with the hole. In any cases, as described in Embodiment 1, the thermoelectric generation unit 103 and the second junction may be connected using the heat transfer member such as the heat pipe and the like. In this case, the heat pipe also configures the thermoelectric generation unit 103.

That is, by connecting the second junction to any member or medium which is not contacted with the cover 12, it can use the temperature difference between the cover 12.

(Recapitulation)

The Features of the communication device and the power source device in each of the embodiments of the present invention have been described above.

Since the terms used in each embodiment are examples, the terms may be replaced with terms that are synonymous or include synonymous functions.

The terms such as first, second, to N-th (where N is an integer) used in each of the embodiments and in the claims are used to distinguish two or more configurations and methods of the same kind and are not intended to limit the order or superiority.

INDUSTRIAL APPLICABILITY

The communication device and the power source device of the present embodiment may be used not only for the maintenance hole, hand hole or gutter, but also any places where temperature difference can be maintained.

What is claimed is:

1. A communication device placed at a place which is composed of a material defining a hole, and a cover covering the hole, the communication device comprising:
    a cover contact member obtaining heat of the cover;
    a heat transfer member connected to the cover contact member to transfer heat of the cover,
    a thermoelectric generation unit in which a first junction is connected to the heat transfer member and a second junction is connected to a side wall of the material defining the hole;
    a communication unit performing communication using electric power generated by the thermoelectric generation unit; and
    a lateral push member configured to generate stress pushing the thermoelectric generation unit against the side wall of the material defining the hole
    wherein the lateral push member comprises a portion of the cover contact member and the heat transfer member.

2. The communication device according to claim 1, wherein
    the cover contact member is sandwiched between the cover and an upper surface of the side wall when the communication device is placed at the space.

3. The communication device according to claim 1, wherein
    the cover contact member is elastically deformed so as to apply stress to a back surface of the cover.

4. The communication device according to claim 1, wherein
    the heat transfer member is a plurality of heat pipe.

5. The communication device according to claim 1 further comprising:
    a secondary battery storing electric power generated by the thermoelectric generation unit; and
    wherein the communication unit performs communication using electric power supplied from the secondary battery.

6. The communication device according to claim 5 further comprising:
    a primary battery; and
    wherein in case that the electric power stored at the secondary battery is insufficient, the communication unit performs communication using electric power supplied from the primary battery.

7. The communication device according to claim 1, wherein
    the communication unit transmits an output signal of a sensor which obtains environmental information.

8. The communication device according to claim 1, wherein
    the thermoelectric generation unit has a rectifier circuit which converts alternating current into direct current.

9. A power source device placed at a place which is composed of a material defining a hole, and a cover covering the hole, the power source device comprising:
- a cover contact member obtaining heat of the cover;
- a heat transfer member connected to the cover contact member to transfer the heat of the cover;
- a thermoelectric generation unit in which a first junction is connected to the heat transfer member and a second junction is connected to a side wall of the material defining the hole, and
- a lateral push member configured to generated stress pushing the thermoelectric generation unit against the side wall of the material defining the hole;
- wherein the lateral push member comprises a portion of the cover contact member and the heat transfer member.

10. A communication device placed at a place which is composed of a material defining a hole, and a cover covering the hole, the communication device comprising:
- a cover contact member obtaining heat of the cover, connected to a surface of the cover;
- a heat transfer member connected to the cover contact member to transfer heat of the cover;
- a thermoelectric generation unit including a thermoelectric power generation element, a first thermally conductive adhesive on a first surface of the thermoelectric power generation element and a second thermally conductive adhesive on a second surface of the thermoelectric power generation element, wherein the first thermally conductive adhesive contacts with the heat transfer member, and the second thermally conductive adhesive contacts with a side wall of the of the material defining the hole; and
- a communication unit performing communication using electric power generated by the thermoelectric generation unit
- a lateral push member configured to generate stress pushing the thermoelectric generation element against the side wall of the material defining the hole
- wherein the lateral push member comprises a portion of the cover contact member and the heat transfer member.

11. The communication device according to claim 1, further comprising:
- an antenna connected to the commutation unit to transmit an output signal output from the communication unit, wherein said antenna is grounded to the cover.

12. The communication device according to claim 10, further comprising:
- an antenna connected to the commutation unit to transmit an output signal output from the communication unit, wherein said antenna is grounded to the cover.

* * * * *